United States Patent [19]

Jambotkar et al.

[11] Patent Number: 4,584,763
[45] Date of Patent: Apr. 29, 1986

[54] ONE MASK TECHNIQUE FOR SUBSTRATE CONTACTING IN INTEGRATED CIRCUITS INVOLVING DEEP DIELECTRIC ISOLATION

[75] Inventors: Chakrapani G. Jambotkar, Hopewell Junction; Shashi D. Malaviya, Fishkill, both of N.Y.

[73] Assignee: International Business Machines Corporation, Armonk, N.Y.

[21] Appl. No.: 561,507

[22] Filed: Dec. 15, 1983

[51] Int. Cl.$^4$ .................... H01L 21/265; H01L 21/76
[52] U.S. Cl. .......................... 29/578; 29/571;
29/576 B; 29/576 W; 29/579; 148/1.5;
148/187; 148/DIG. 83; 148/DIG. 143; 357/49;
357/34; 430/311; 156/649
[58] Field of Search ............. 29/571, 578, 579, 576 B,
29/576 W; 148/1.5, 187, DIG. 83, DIG. 143;
430/311-319; 357/49, 34, 35; 156/649

[56] References Cited

U.S. PATENT DOCUMENTS

| 3,817,750 | 6/1974 | Kaiser | 29/576 X |
| 4,084,987 | 4/1978 | Godber | 29/579 X |
| 4,104,070 | 8/1978 | Moritz et al. | 430/329 |
| 4,196,228 | 4/1980 | Priel et al. | 148/187 X |
| 4,256,514 | 3/1981 | Pogge | 148/187 X |
| 4,309,812 | 1/1982 | Horng et al. | 29/578 |
| 4,472,873 | 9/1984 | Ko | 29/576 B |
| 4,498,224 | 2/1985 | Maeguchi | 29/576 B X |
| 4,502,205 | 3/1985 | Yahano | 29/576 B |

Primary Examiner—Brian E. Hearn
Assistant Examiner—David A. Hey
Attorney, Agent, or Firm—Sughrue, Mion, Zinn, Macpeak and Seas

[57] ABSTRACT

A one mask technique for making substrate contact from the top surface of an integrated circuit device. A thin ion implanted region of one conductivity type is formed over the entirety of a major surface of the semiconductor substrate. By lithography and etching, a shallow etched region is formed to a depth below the region of the first conductivity type at the substrate surface in an area designated for substitute contacting. A region of a second conductivity type is then formed at the central portion of the etched region. The substrate is then heated to form a buried collector region of the first conductivity type and a portion of the reach-through region of the second conductivity type in the substrate. An epitaxial layer is next formed on the major surface of the substrate. A base region of the second conductivity type for the integrated circuit is then formed. A portion of the substrate reach-through, which is directly above the portion of the substrate reach-through previously formed, is also simultaneously formed along with the base. Then, emitter and collector reach-through regions are formed in the epitaxial layer followed by the step of providing electrical contacts. Deep dielectric isolation walls are formed at a suitable stage in the processing.

8 Claims, 6 Drawing Figures 4,584,763

ONE MASK TECHNIQUE FOR SUBSTRATE CONTACTING IN INTEGRATED CIRCUITS INVOLVING DEEP DIELECTRIC ISOLATION

BACKGROUND OF THE INVENTION

This invention relates to a one mask technique and the resulting structure for making a substrate contact from the top surface of an integrated circuit device. The technique is particularly useful for bipolar integrated circuit structures wherein buried collectors are normally formed in a maskless, blanket fashion and devices subsequently isolated through one of the deep-isolation techniques.

In bipolar integrated circuits, a low-resistance path to bias the substrate is normally required. Further, in the case of certain types of chip packaging, the substrate biasing contact location must be situated at the top surface of the chip.

Normally, in the case of integrated circuits involving deep-dielectric isolation walls, the method to realize top substrate contact would involve employing one masking step to pattern the buried collectors and at least one more masking step to achieve a low-resistance access to the substrate. This invention provides top substrate contacting by using only one masking step to pattern the buried collectors and also simultaneously achieve a low-resistance access to the substrate.

As stated in the foregoing, the technique of this invention has particular applicability to integrated circuits involving deep dielectric isolation. However, the technique is also directly applicable in the case of integrated circuits which involve conventional isolation methods, i.e, those incorporating exclusively PN junction isolation or partial PN junction isolation in conjunction with recessed oxide isolation. In integrated circuits involving one of these conventional isolation schemes, the application of this invention would normally be restricted to the cases where the doping of the buried collectors is moderate so that the collector-substrate capacitance would not be excessive.

Prior art techniques of forming substrate contacts, that have been evaluated vis-a-vis this invention are U.S. Pat. Nos. 3,817,750; 4,196,228; 4,256,514; and 4,309,812. None are considered to be relevant to this invention.

SUMMARY OF THE INVENTION

It is a primary object of this invention to provide a method for forming a low-resistance path from the top of a silicon chip to the buried substrate utilizing a minimum number of photolithographic masking operations.

With particular reference to bipolar integrated circuits, this and other objects of the present invention are achieved, essentially as follows. A thin ion implanted region of one conductivity type is formed over the entirety of a major surface of the semiconductor substrate. Then, utilizing lithography and etching techniques, a shallow etched region is formed to a depth below the region of the first conductivity type at the substrate surface in an area designated for substrate contacting. It is understood that, if necessary more than one substrate contact may exist. A region of a second conductivity type is then formed at the central portion of the etched region. The substrate is then heated to form a buried collector region of the first conductivity type and a portion of the reach-through region of the second conductivity type in the substrate. An epitaxial layer is next formed on the major surface of the substrate. A base region of the second conductivity type for the integrated circuit is then formed. A portion of the substrate reach-through, which is directly above the portion of the substrate reach-through formed earlier, is also simultaneously formed along with the base. Then, emitter and collector reach-through regions are formed in the epitaxial layer followed by the step of providing electrical contacts to the emitter, base, collector and substrate reach-through regions. Deep dielectric isolation walls are formed at a suitable stage in the above processing in accordance with known prior art techniques. If the integrated circuits involve NPN devices, and possibly PNP devices of the "lateral" type, then first and second conductivities are of the N and P-type, respectively.

This invention will be defined in greater detail by referring to the attached drawing and the description of the preferred embodiment that follows.

DESCRIPTION OF THE PREFERRED EMBODIMENT

As described herein, this invention achieves a substrate contact at the top surface of the integrated circuit chip requiring only a single masking operation.

Figure 1:
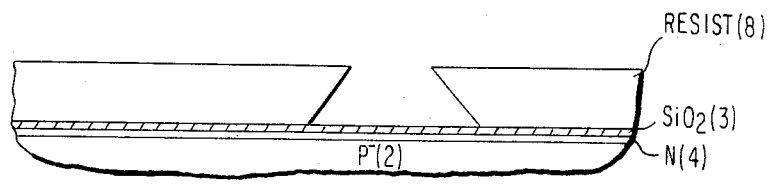
FIGS. 1–6 are schematic cross-sectional elevation views showing the essence of the steps of forming a device in accordance with the present invention.

Referring to FIG. 1, the processing method begins with a silicon substrate 2 of one conductivity type. The embodiment shown in FIG. 1 utilizes a P-substrate having formed thereon a thin silicon dioxide layer 3. By ion implantation, an N-type layer 4 is formed beneath the oxide layer 3. A layer of photoresist 8 is coated having a thickness of approximately 1.5 microns. Utilizing a technique such as described in U.S. Pat. No. 4,104,070, patterns are deliberately formed in the photoresist 8 having inverse mesa-like cross-sections as shown in FIG. 1. The vertical walls in the patterned photoresist 8 taper inward from its top surface at an angle of approximately 45°–55° to form the edge slopes as illustrated.

A selective etchant is used to etch the exposed portions of oxide 3. Either a gas of liquid etchant such as buffered hydrofluoric acid which does not attack the photoresist may be used. A selective etchant is used next to etch the newly exposed portions of silicon. Once again either a gas or liquid etchant such as pyrocatechol which selectively etches only silicon may be used. In this etching, the exposed silicon is etched to a depth slightly greater than that of the depth of the N implant layer 4. A typical etching depth is in the range of 2000 Å. As a result, the structure shown in FIG. 2 results.

Figure 3:
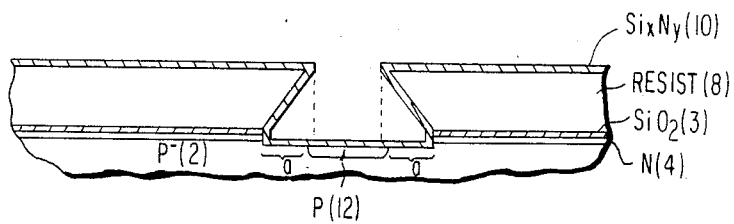

Referring now to FIG. 3, by utilizing plasma deposition techniques a thin layer of $Si_xN_y$ is deposited over the wafer surface. This layer 10 is deposited at a low temperature, such as approximately 245° C. over the wafer surface. By ion implantation, a P-type impurity 12 is deposited beneath the $Si_xN_y$ layer as illustrated in FIG. 3. It is noted that the $Si_xN_y$ layer is not necessary but preferred to serve as a screen layer during implantation of the P impurity 12. During this step it should be noted that the inverse mesa-like structure of the photoresist serves as a mask during the P implant to situate the P implant approximately 1.2–1.5 μm away from the bottom peripheral portion of the inverse mesa. This typical distance, 1.2–1.5 μm is shown in FIG. 3 as the distance "a." The distance "a" is determined by the thickness and the edge slope of the photoresist layer 8.

Figure 4:
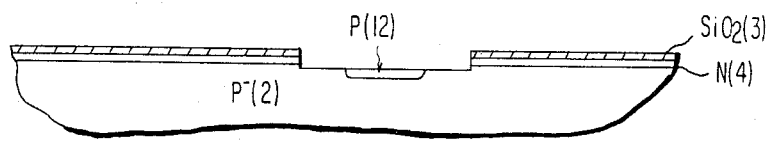
Figure 5:
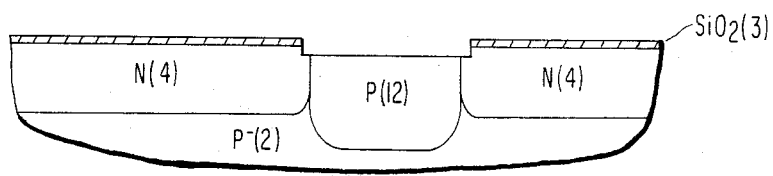

FIG. 4 illustrates the removal of the $Si_xN_y$ layer 10 utilizing, for example, hot $H_3PO_4$ acid. Then, the photoresist 8 is stripped off leaving the structure as illustrated in FIG. 4. By heating, the N and P impurities are driven into the structure to obtain the device shown in FIG. 5.

The next step is the removal of the $SiO_2$ layer 3 and then forming an N- epi layer 14 in the structure. This is followed by formation of a N reach-through, P base and N emitter in a conventional fashion. Windows for metal contacts are opened in the conventional passivation layers at the top surface of the substrate. Deep dielectric isolation walls 18 are formed at a suitable stage in the above processing in accordance with known prior art techniques such as anisotropic etching. The device fabrication is completed by obtaining interconnection metallization patterns following a conventional method.

Figure 6:
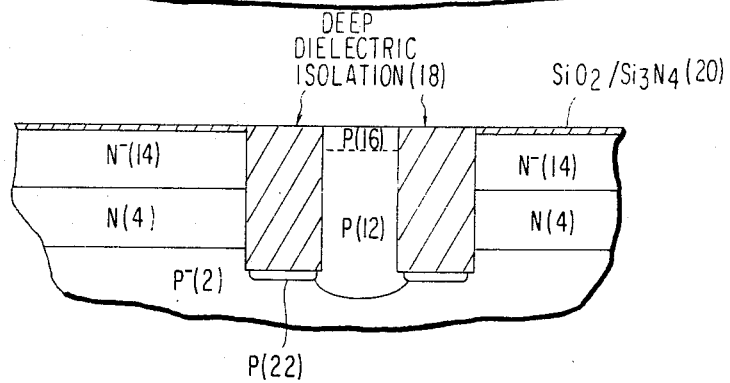

FIG. 6 therefore illustrates the essential wafer cross-section of the substrate contacting region. The P region 16 is that region which is formed simultaneously with the P base and merges with the upward diffused P region 12 to provide a P substrate reachthrough. The P region 22 in FIG. 6 represents a channel stopper which may have been formed beneath the deep dielectric isolation regions 18 in accordance with the prior art. During processing, P regions 12 and 22 preferably merge to minimize substrate reach-through resistance. FIG. 6 also illustrates the presence of a $SiO_2$—$Si_3N_4$ passivation layer which may have been formed on the top surface of the substrate. This is illustrated as layer 20 in FIG. 6.

Figure 2:
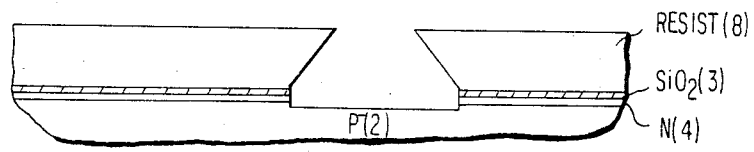

It should be noted that the step of etching the silicon as shown in FIG. 2 simultaneously serves two distinct and independent purposes. First, it removes the N implantation layer in the desired regions. Secondly, it provides a topographical step which aids later mask alignments.

It should also be observed that while both N 4 and P 12 doped regions are rather heavily doped for well-known reasons, the above processing method specifically prevents their merger at high concentration levels. It is known that if these heavily doped regions are allowed to merge, i.e., form a junction, at relatively high concentration levels, then that often leads to the formation of silicon defects during subsequent conventional processing.

The present invention prevents merger of the rather heavily doped N 4 and P 12 regions at high concentration levels, first, by the deliberate realization of inverse mesa shapes in the photoresist 8 and, second, by exploiting the fact that photoresist can serve as a mask against ion implantation into silicon directly beneath it. As shown in FIG. 3, the N 4 and P 12 regions are thus separated by distance "a" at the time of introduction of the P 12 dopant. At the end of all hot processing, it is therefore ensured that the junction of N 4 and P 12 regions is at very moderate or low concentration levels.

While this invention has been described relative to its preferred embodiment, it is clear that modifications may be practiced without departing from the essential scope of the invention. For example, in the plasma deposition step shown in FIG. 3 to deposit a thin layer 10, low-temperature $SiO_x$ or $SiO_2$ could be used as an alternative in place of $Si_xN_y$. Also, while the formation of an NPN device has been described, it is apparent that a PNP structure can be constructed using the teachings of this invention.

It is apparent that other processing steps can be practiced in accordance with the present invention in addition to those described herein without departing from the essential scope thereof.

We claim:

1. A method of making a low resistance access path to the substrate of an integrated circuit comprising transistors from the top surface of the integrated circuit body using a single mask comprising:
   forming a thin region of one conductivity type on a major surface of a silicon substrate of the opposite conductivity type;
   etching a shallow region to a depth below said region of one conductivity type in said major surface in an area designated to have said substrate contact;
   by forming a silicon dioxide layer on said substrate forming a photoresist layer on said silicon dioxide layer and forming undercut mesa shapes in said photoresist through photolithographic techniques, etching exposed portions of said silicon dioxide layer and then etching in the newly exposed portion of said silicon substrate said shallow region to a depth below said thin region;
   forming a region of the opposite conductivity type at a central portion of said shallow region;
   heating the structure to form a buried collector region and a substrate reach-through region in said substrate;
   forming an epitaxial layer on said major surface of said substrate;
   forming isolation regions around said transistors and said substrate contact region through said epitaxial layer and filling said isolation region with isolation material;
   simultaneously forming a base region and the substrate reach-through region for said integrated circuit in said epitaxial layer, wherein said substrate reach-through region in said substrate is directly under and in merger with said substrate reach-through region in said epitaxial layer;
   forming emitter and collector reach-through regions of said integrated circuit in said epitaxial layer; and
   establishing electrical contacts to the thus formed integrated circuit, 2. The method of claim 1 wherein said substrate is a P type material and said thin region is of an N type material.

3. The method of claim 2 wherein the step of forming said thin region of N conductivity type comprises the steps of forming said silicon dioxide layer onto said P type substrate and implanting N type dopant beneath said silicon dioxide layer.

4. The method of claim 3 wherein the step of forming said region of the opposite conductivity type comprises the steps of leaving said photoresist intact, depositing an insulating layer over the substrate and ion-implanting beneath said insulating layer a P type dopant with said undercut mesa shapes in said photoresist positioning said ion-implanted P type dopant at said central portion of said shallow region.

5. The method of claim 4 wherein said insulating layer is obtained through a low temperature deposition of $Si_xN_y$.

6. The method of claim 4 wherein said insulating layer is obtained through a low temperature deposition of $SiO_2$.

7. The method of claim 1 further comprising the step of removing said photoresist prior to the step of heating.

8. The method of claim 1 wherein the step of forming isolation regions comprises the steps of forming deep trenches in said silicon substrate by anisotropic etching.

* * * * *